United States Patent
Hsieh et al.

(10) Patent No.: US 6,228,695 B1
(45) Date of Patent: May 8, 2001

(54) METHOD TO FABRICATE SPLIT-GATE WITH SELF-ALIGNED SOURCE AND SELF-ALIGNED FLOATING GATE TO CONTROL GATE

(75) Inventors: Chia-Ta Hsieh, Tainan; Hung-Cheng Sung, Hsin-Chu; Yai-Fen Lin, Non-Tour; Jack Yeh, Hsin-Chu; Di-Son Kuo, Hsinchu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/320,759

(22) Filed: May 27, 1999

(51) Int. Cl.[7] .................................................. H01L 21/8238
(52) U.S. Cl. ......................... 438/201; 438/211; 438/257
(58) Field of Search .................................. 438/201, 211, 438/257

(56) References Cited

U.S. PATENT DOCUMENTS

| 4,861,730 | 8/1989 | Hsia et al. ........................ 437/43 |
| 5,063,172 | 11/1991 | Manley ............................ 437/43 |
| 5,750,427 | 5/1998 | Kaya et al. ...................... 438/264 |
| 5,824,584 | 10/1998 | Chen et al. ..................... 438/267 |
| 5,830,794 | * 11/1998 | Kusunoki et al. ............... 438/266 |
| 5,858,840 | 1/1999 | Hsieh et al. .................... 438/266 |
| 6,074,914 | * 6/2000 | Ogura ............................. 438/257 |
| 6,117,733 | * 9/2000 | Sung et al. ..................... 438/265 |
| 6,124,609 | * 9/2000 | Hsieh et al. .................... 257/315 |
| 6,133,097 | * 11/1998 | Hsieh et al. .................... 438/266 |

FOREIGN PATENT DOCUMENTS 11-274328 * 10/1999 (JP) .

* cited by examiner

Primary Examiner—T. N. Quach
(74) Attorney, Agent, or Firm—George O. Saile; Stephen B. Ackerman; Sevgin Oktay

(57) ABSTRACT

A split-gate flash memory cell having self-aligned source and floating gate self-aligned to control gate is disclosed as well as a method of forming the same. This is accomplished by depositing over a gate oxide layer on a silicon substrate a poly-1 layer to form a vertical control gate followed by depositing a poly-2 layer to form a spacer floating gate adjacent to the control gate with an intervening intergate oxide layer. The source is self-aligned and the floating gate is also formed to be self-aligned to the control gate, thus making it possible to reduce the cell size. The resulting self-aligned source alleviates punch-through from source to control gate while the self-aligned floating gate with respect to the control gate provides improved programmability. The method also replaces the conventional poly oxidation process thereby yielding improved sharp peak of floating gate for improved erasing and writing of the split-gate flash memory cell.

25 Claims, 9 Drawing Sheets

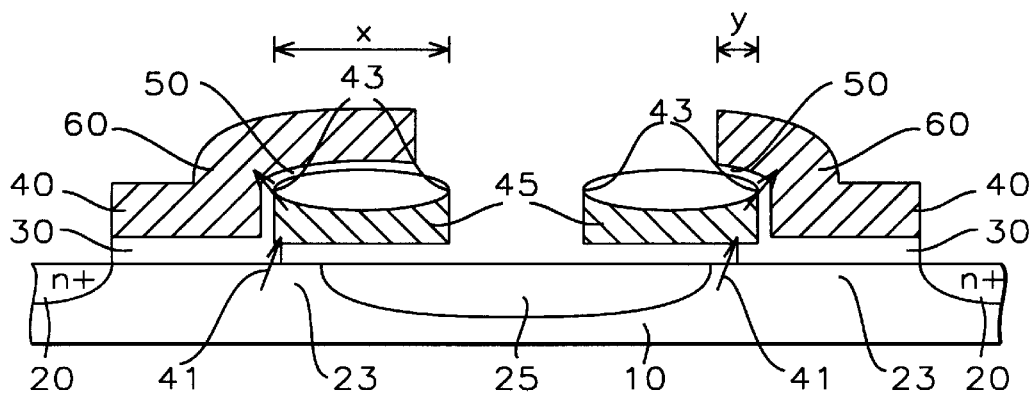
FIG. 1a – Prior Art
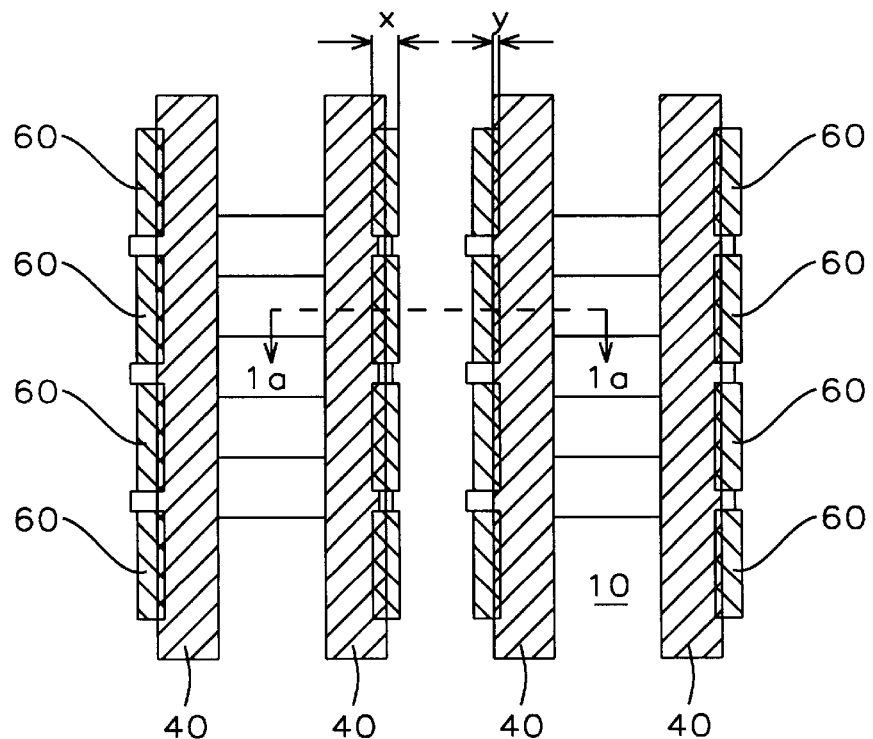
FIG. 1b – Prior Art

METHOD TO FABRICATE SPLIT-GATE WITH SELF-ALIGNED SOURCE AND SELF-ALIGNED FLOATING GATE TO CONTROL GATE

BACKGROUND OF THE INVENTION (1) Field of the Invention

The present invention relates to semiconductor memory devices and more particularly to a method of forming a split-gate flash memory cell having a self-aligned source as well as a floating gate self-aligned to a control gate.

(2) Description of the Related Art

A split-gate flash memory device is characterized by its split-gate side (between the control gate and the drain) and the stacked-side (between the floating gate and the source). Conventionally, the floating gate is not self-aligned to the control gate, and neither is the self-aligned source commonly used. Without self-aligned source, the problem of punch-through from the source to the control gate is encountered which in turn causes programming fails. And in the absence of alignment between the floating gate and the control gate, the misalignment causes variability of the coupling ratio, which also causes weak programmability in the cell. As is known, the coupling ratio affects the program speed, that is, the larger the coupling ratio, the faster is the programming speed, and is not a fixed value by virtue of the variability of the channel length and hence that of the overlap between the floating gate and the source. Usually, if channel length is increased through greater lateral diffusion in the source region, punch-through occurs due to excessive current well below the threshold voltage. It is disclosed later in the embodiments of this invention that these problems can be alleviated by forming self-aligned source and also self-aligned floating gate with respect to the control gate. As an added advantage, it is shown that the cell size can be reduced by using self-alignment methods and self-aligned structures of this invention.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions.

Programming and erasing performance is degraded by the offset between the floating gate and source and drain regions.

Most conventional flash-EEPROM cells use a double-polysilicon (poly) structure of which the well known split-gate cell is shown in FIG. 1a. Here, two MOS transistors share a source (25). Each transistor is formed on a semiconductor substrate (10) having a first doped region (20), a second doped region (25), a channel region (23), a gate oxide (30), a floating gate (40), intergate dielectric layer (50) and control gate (60). Substrate (10) and channel region (23) have a first conductivity type, and the first (20) and second (25) doped regions have a second conductivity type that is opposite the first conductivity type.

As seen in FIG. 1a, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1a, control gate (60) overlaps the channel region, (23) under the floating gate, (40). This structure is needed because when the cell is erased, it leaves a positive charge on the floating gate.

As a result, the channel under the floating gate becomes inverted. The series MOS transistor (formed by the control gate over the channel region) is needed in order to prevent current flow from control gate to floating gate. The length of the transistor, that is the overlap of the control gate over the channel region (23) determines the cell performance. Furthermore, edges (41), (43) can affect the programming of the cell by the source size and hot electron injection through the intergate dielectric layer (50) at such edges. Hot electron injection is further affected by, what is called, gate bird's beak (43) that is formed in conventional cells. On the other hand, it will be known to those skilled in the art that corners such as (41) can affect the source coupling ratio also.

To program the transistor shown in FIG. 1a, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (25) and drain (20), and to control gate (60), and then sensing the amount of charge on floating gate (40). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate.

In the conventional memory cell shown in FIG. 1a, word lines (not shown) are connected to control gate (60) of the MOS transistor, while the length of the MOS transistor itself is defined by the source (25) drain (20) n+ regions shown in the same Figure. As is well known by those skilled in the art, the transistor channel is defined by masking the n+ regions. However, the channel length of the transistor varies depending upon the alignment of the floating gate (40) with the source and drain regions. This introduces significant variations in cell performance from die to die and from wafer to wafer. Furthermore, the uncertainty in the final position of the n+ regions causes variations in the series resistance of the bit lines connected to those regions, and hence additional variation in the cell performance.

In prior art, Hsia, et al., of U.S. Pat. No. 4,861,730 teach a process for producing a high density split gate nonvolatile memory cell which includes a floating gate and a control gate that is formed above the floating gate. The drain region is self-aligned to the floating gate and source region is self-aligned to the control gate. In U.S. Pat. No. 5,063,172, Manley discloses an integrated circuit fabrication method that utilizes a conductive spacer to define the gate length of the series select transistor in a split-gate memory cell, thereby eliminating misalignment problems.

On the other hand, Chen, et al., in U.S. Pat. No. 5,824,484 disclose a sidewall select gate which is formed in conjunction with a semiconductor doped oxide to form a nonvolatile memory cell. In another U.S. Pat. No. 5,750,427 Kaya, et al., disclose a non-volatile split-gate memory cell which can be programmed with only a five volt power supply and is fabricated using standard transistor processing methods. Also, a method to improve erase speed of split-gate flash is taught by Hsieh, et al., in U.S. Pat. No. 5,858,840 by judiciously implanting nitrogen ions in the first polysilicon layer and then removing them from the area where the floating gate is to be formed.

While prior art offers different approaches for forming different split-gate flash memory cells, the present invention discloses a still different method where the floating gate is aligned to the control gate. In the split-gate cells shown in FIG. 1 of prior art, floating gate (40) is not aligned to control gate (60) for the dimensions (x) and (y) are different. This is also shown in a top view given in FIG. 1b. It is disclosed later in the embodiments of this invention, where this variability is avoided and the performance of the split-gate flash memory cell is improved.

SUMMARY OF THE INVENTION

It is therefore an object of this invention to provide a method of forming split-gate flash memory with self-aligned source.

It is another object of this invention to provide a method of forming split-gate flash memory with self-aligned floating gate to control gate.

It is yet another object of the present invention to provide a split-gate flash memory cell with both self-aligned source as well as self-aligned floating gate to control gate in order to alleviate punch-through from source to control gate as well as to improve programmability of the cell.

These objects are accomplished by providing a silicon substrate having a plurality of active and field regions defined by shallow trench isolation (STI); forming first gate oxide layer over said substrate; forming first polysilicon (poly-1) layer over said first gate oxide layer; forming silicide layer over said poly-1 layer; forming tetraethyl orthosilicate (TEOS) layer over said silicide layer; forming first photoresist layer over said TEOS layer; patterning said first photoresist layer to define control gate area; etching said TEOS layer through said patterning in said first photoresist layer and forming opening in said TEOS layer exposing portion of said poly-1 layer; etching said exposed portion of said poly-1 layer and forming control gate; removing said first photoresist layer; forming second gate oxide layer over said substrate; forming partial-depth second polysilicon (poly-2) layer over said second gate oxide layer; etching said partial-depth poly-2 layer to form drain spacer and source spacer and sharp peak therein; forming second photoresist layer over said substrate to define self-align source (SAS) region; etching partially said second gate oxide layer through said second photoresist layer in said SAS region; removing said second photoresist layer; forming third photoresist layer over said substrate with openings exposing said poly-2 drain spacer and said poly-2 covering said STI regions; etching through said openings in said third photoresist layer to remove said poly-2 drain spacer and said poly-2 covering said STI regions to form floating gate cell; forming fourth photoresist layer over said substrate to redefine self-align source (SAS) region; etching completely said second gate oxide layer through said fourth photoresist layer until said silicon substrate is reached in said SAS region; ion implanting said SAS region; removing said fourth photoresist layer; annealing said tungsten silicide layer; forming drain in said substrate; forming interlevel dielectric layer (ILD) over said substrate; and forming metal contact in said ILD layer to complete the forming of said split-gate flash memory cell.

These objects are further accomplished by providing memory cell comprising a substrate having active and field regions defined; a gate oxide formed over said substrate; a poly-1 layer forming a columnar control gate over said gate oxide; a silicide layer covering said columnar control gate; a TEOS layer covering said silicide layer; a poly-2 layer forming a spacer floating gate adjacent and self-aligned to said columnar control gate with an intervening intergate oxide layer; a sharp poly-2 peak in said spacer floating gate; and a self-aligned source in said split-gate flash memory cell.

BRIEF DESCRIPTION OF THE DRAWINGS

FIG. 1a shows a cross-sectional view of a split-gate type memory cell of prior art.

FIG. 1b shows a top view of the split-gate memory cell of prior art of FIG. 1a.

FIGS. 3a–3h will now be described more fully as follows:

FIG. 3a is a cross-sectional view of the semiconductor substrate of FIG. 2a showing the forming of the passive and active regions according to this invention.

FIG. 3b is a cross-sectional view of the semiconductor substrate of FIG. 2b showing the forming of the vertical control gate of this invention underlying the silicide and TEOS layers according to this invention.

FIG. 3c is a cross-sectional view of the semiconductor substrate of FIG. 2c showing the forming of the spacer floating gate self-aligned to the control gate of this invention.

FIG. 3d is a cross-sectional view of the semiconductor substrate of FIG. 2d showing the forming of the self-aligned source (SAS) of to this invention.

FIG. 3e is a cross-sectional view of the semiconductor substrate of FIG. 2e showing the etching of the poly-2 not covered by a photoresist layer according to this invention.

FIG. 3f is a cross-sectional view of the semiconductor substrate of FIG. 2f showing the ion implanting of the SAS According to this invention.

FIG. 3g is a cross-sectional view of the semiconducctor substrate of FIG. 2g showing the forming of the drain of the memory cell of this invention.

FIGS. 3h and 3i show, respectively, the erasing and writing operations of the disclosed split-gate flash memory cell represented by the cross-sectional view taken at the 3h—3h location shown in FIG. 2h.

DESCRIPTION OF THE PREFERRED EMBODIMENTS

Figure 2A:
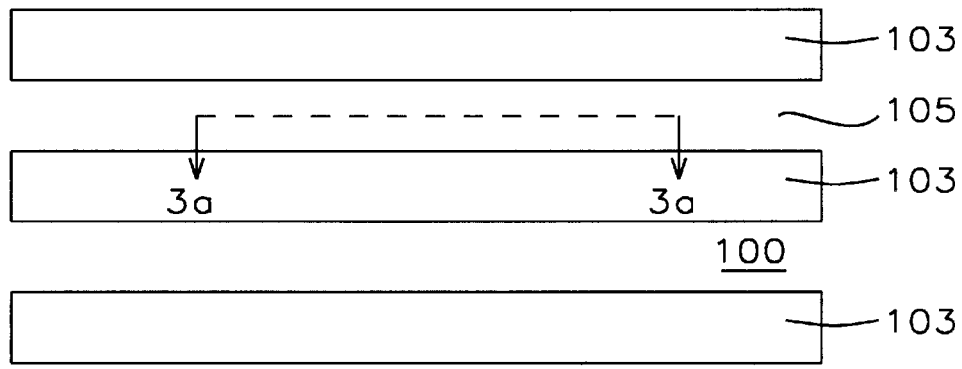
FIGS. 2a–2h show plan view of a semiconductor substrate at different stages of the disclosed processing steps.
Figure 2B:
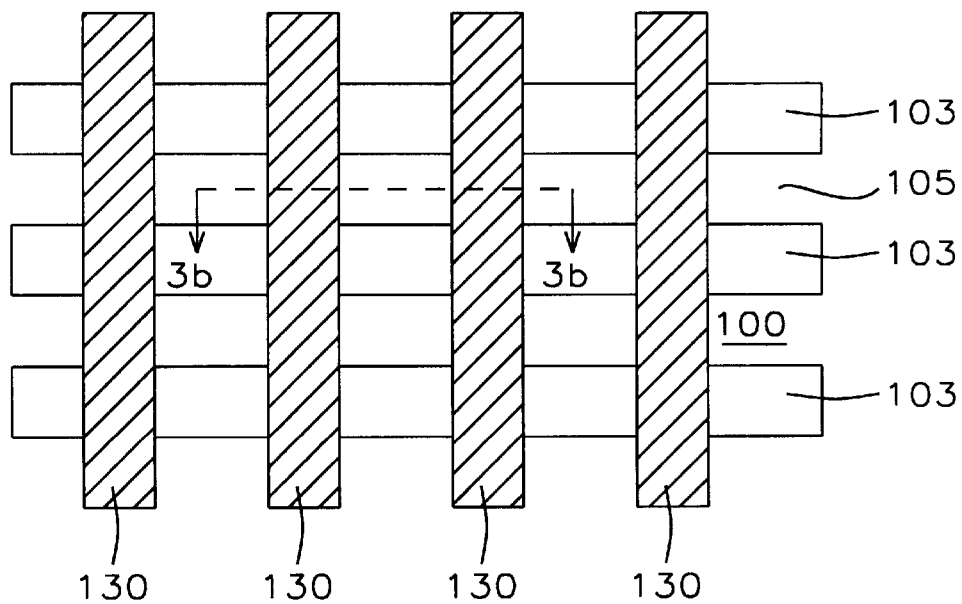
Figure 2C:
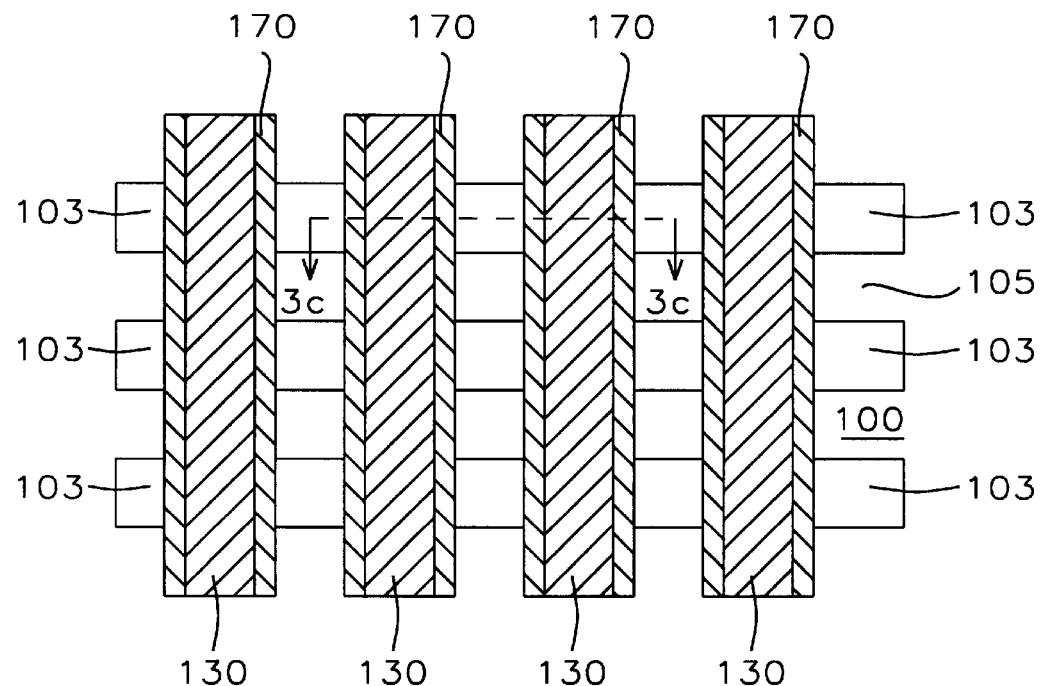

Referring now to the drawings, specifically to FIGS. 2a–2h, and FIGS. 3a–3i, there is shown a method of forming a split gate flash memory cell having both a self-aligned source as well a floating gate self-aligned to a control gate. FIGS. 2a–2h show plan views of a semiconductor substrate at different stages of the disclosed processing steps. FIGS. 3a–3i, on the other hand, show cross-sectional views of the substrate corresponding to locations shown on FIGS. 2a–2h. FIGS. 3h and 3i show the writing (programming) and erasing operations of the disclosed memory cell represented by the cross-sectional view taken at the 3h—3h location shown in FIG. 2h.

Figure 3A:
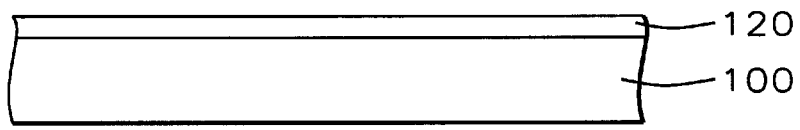
FIGS. 3a–3h, on the other hand, show cross-sectional views of the substrate corresponding to locations shown on FIGS. 2a–2h.

FIG. 2a, substrate (100), preferably silicon, is provided with field regions (103), and active device regions (105) already formed using the well known methods including the LOCOS (local oxidation of silicon) method or the STI (shallow trench isolation) method. A first gate oxide layer (120) is next grown thermally over the substrate at a temperature between about 850 to 950° C. to a thickness between about 190 to 210 angstroms (Å). Alternatively, the gate oxide can be formed by an atmospheric or low pressure chemical vapor deposition (LPCVD) process as is well known. A cross-sectional view of the substrate including the first gate oxide layer is shown in FIG. 3a corresponding to the location shown in FIG. 2a.

Next, a first polysilicon layer (poly-1) (130) (not shown as a blanket layer) is blanket deposited over the first gate oxide layer (120). This is accomplished through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 550 to 620° C. The preferred thickness of the poly-1 layer is between about 900 to 1100 angstroms (Å). It will be noted from FIG. 3b that gate oxide layer (120) serves the function of a control gate oxide here.

The poly-1 deposition is followed by the deposition of silicide layer (140). As is known in the art, silicides can be formed by either deposition of pure metal on silicon or co-evaporation of silicon and refractory metal from two sources, or by sputter-depositing silicide from a composite target, or by co-sputtering or layering. The metal is usually selected from a refractory group consisting of tungsten, titanium, tantalum, molybdenum, and platinum and can either be deposited as a pure metal on a silicon bearing surface, or co-evaporated with silicon. Here, it is preferred that layer (140) is formed by co-sputtering tungsten to a thickness between about 800 to 1500 Å.

A layer of oxide is then deposited over the substrate through the decomposition of tetraethyl orthosilicate (TEOS) at a temperature between about 600 to 650° C. Plasma Enhanced PECVD TEOS films can also be deposited at lower temperatures. It is preferred that the decomposition temperature here is between about 300 to 400° C., and that the thickness of TEOS layer (150) is between about 1900 to 2100 Å.

Figure 3B:
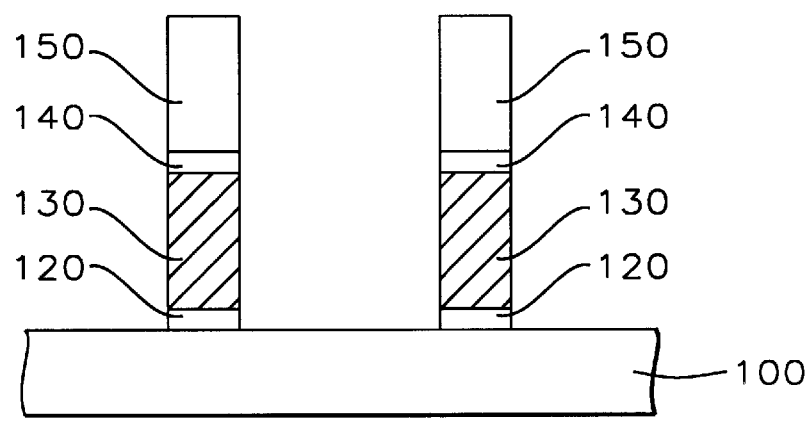

A first photoresist layer, (not shown) is next formed and patterned to define the control gate regions over the substrate. Using the patterned first photoresist layer as a photoresist mask, layers (150), (140) and (130) are then etched to form a vertical control gate (130) disposed below tungsten silicide ($WSi_x$) layer (140) and TEOS layer (150) as shown in FIG. 3b. It will be noted from FIG. 3b that the etching is continued with high selectivity until silicon substrate is reached. Etching is accomplished in a HDP (high-density plasma) etcher with etch recipe comprising gases $O_2$, HBr, $Cl_2$ and He to etch the $WSi_x$ and Si, while $CF_4$, $CHF_3$ and $O_2$ gases are used to etch the TEOS layer. For clarity, in the top view of the substrate shown in FIG. 2b, control gate (130) is shown without the overlying silicide and TEOS layers. The layered structure is better seen in the cross-sectional view in FIG. 3b.

Figure 3C:
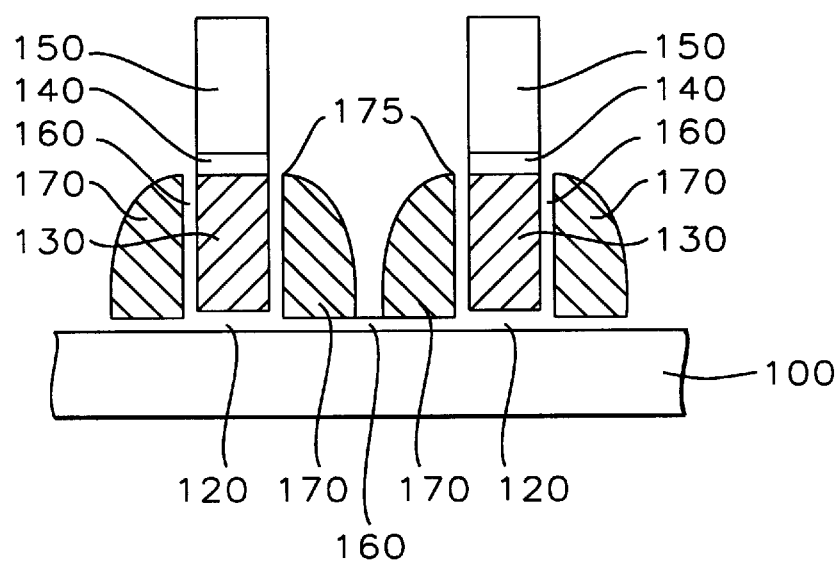

Next, a second gate oxide layer, this time serving as a floating gate oxide as well as an inter-gate or inter-poly oxide between control gate (130) and the to-be-formed floating gate (170) shown in FIG. 3c is thermally grown to a thickness between about 70 to 90 Å at a temperature between about 850 to 950° C. This is followed by forming a second blanket polysilicon (poly-2) layer (not shown as a blanket layer in FIG. 3c) preferably using the same LPCVD method as in forming the poly-1 layer, with silane $SiH_4$ as a silicon source material at a temperature range between about 550 to 620° C. However, the blanket deposition of poly-2 is performed only to a partial depth, that is to the same thickness as the poly-1 layer of between about 1900 to 2100 Å so that the poly-2 layer does not reach to the height of the silicide layer nor that of the TEOS layer. The so formed partial-depth poly-2 layer is then etched anisotropically to form a spacer floating gate (170) as shown in FIG. 3c. A top view of spacer (170) can also be seen in FIG. 2c. It is preferred that the etch recipe comprises $O_2$, HBr, $Cl_2$ and He.

It will be apparent to those skilled in the art that the method disclosed above enables the forming of the spacer floating gate (170) self-aligned to the vertical control gate (130), which is the main feature of this invention. Furthermore the etching forms a sharp peak of poly-2 (175) which is a key aspect for controlling the coupling ratio between the vertical control gate and the spacer floating gate of this invention, which in turn enhances the erasing function of the cell.

Figure 2D:
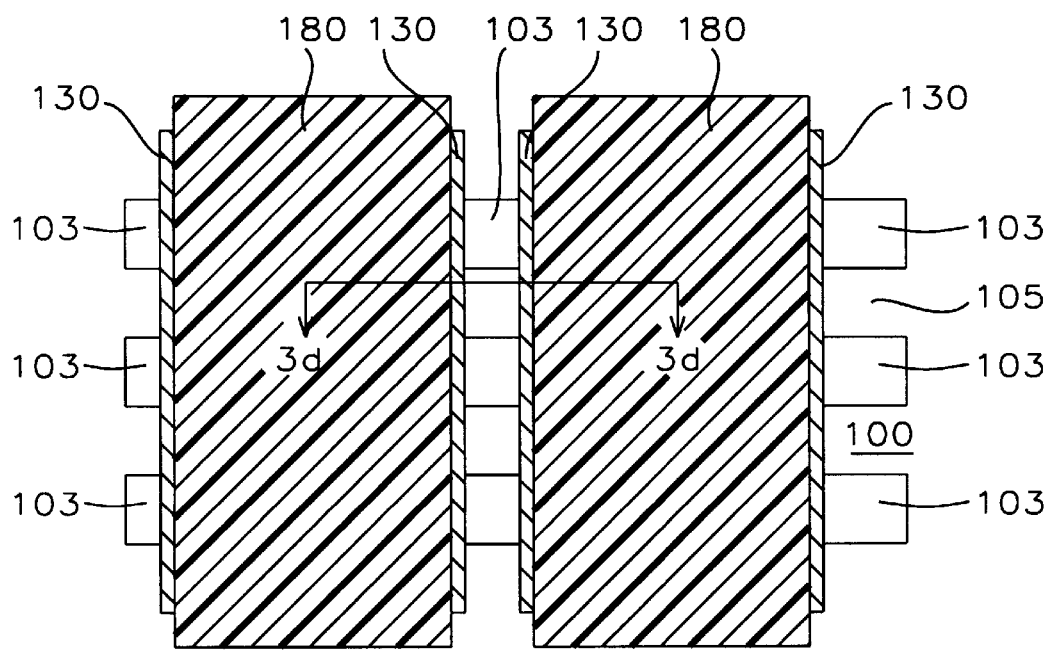
Figure 2E:
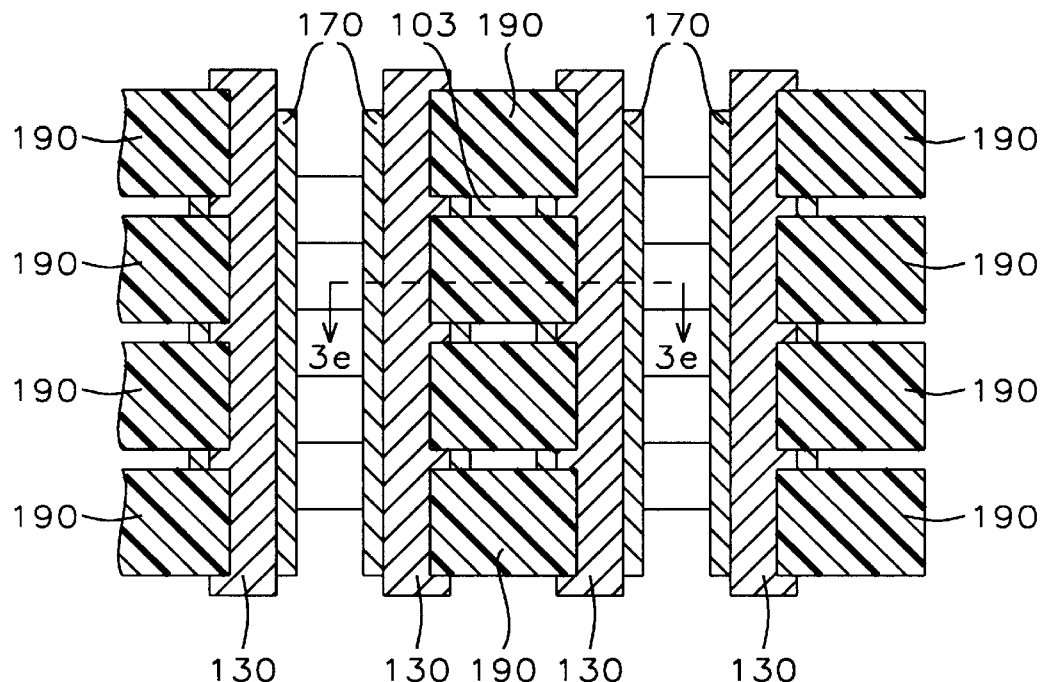
Figure 3D:
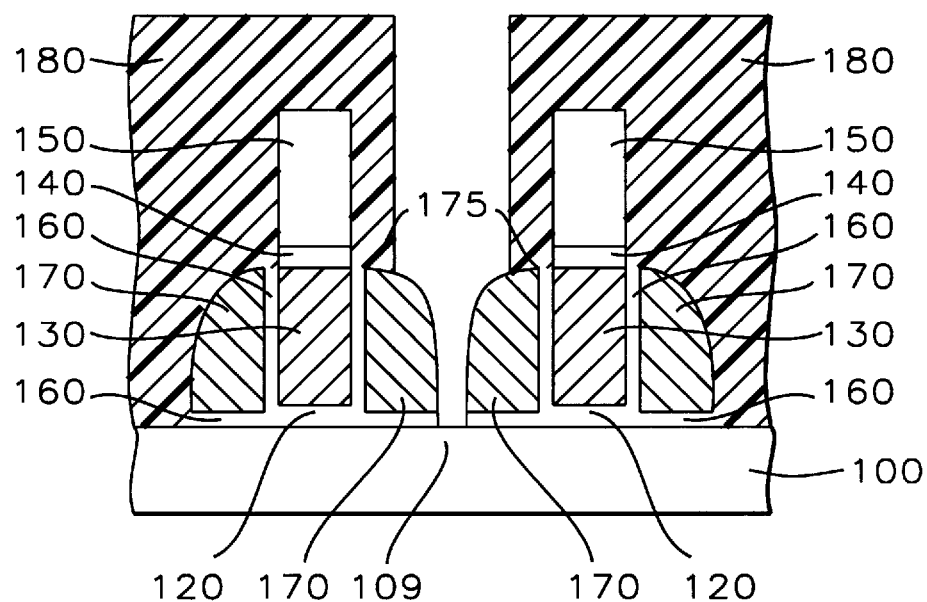
Figure 3E:
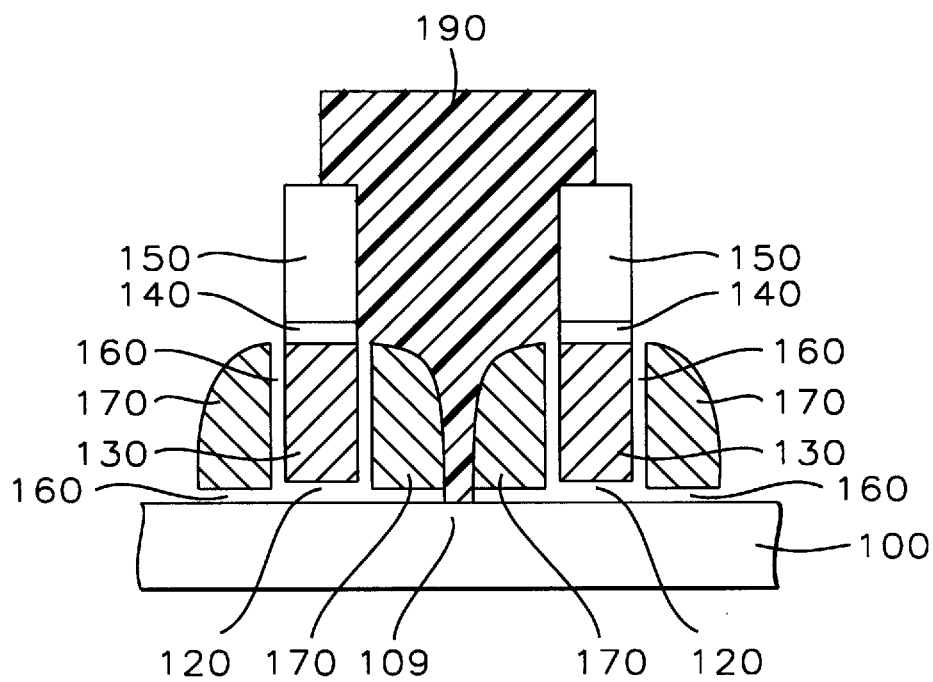

At the next step, a second photoresist layer (180) is formed over the substrate as shown in both FIGS. 2d and 3d and patterned to define self-aligned source (SAS) region (109). Then etching is performed through the patterns in the second photoresist layer by using a dry etch recipe comprising $CF_4$, $CHF_3$ and $O_2$. It will be noted that this recipe will etch oxide only, and not silicon. However, it is important that etching is carried out so that not all of the oxide in region (103) is removed. It is preferred that an oxide layer with a thickness between about 300 to 600 Å remains in regions (103) that are exposed to etching as shown in FIGS. 2d and 2e. The remaining oxide will serve as an etch stop when poly-2 spacer is next removed.

It will be appreciated by those skilled in the art that the sharp peak (175) of poly-2, that is, of the spacer floating gate (170), is well protected during this step of SAS defining. Normally, the peak (43) of prior art shown in FIG. 1a, for example, would be damaged during the forming of source because it is not protected by a layer of photoresist and polysilicon, as is the case with the method disclosed here as shown in FIG. 3d. Thus, it is another key aspect of the present invention that photoresist and polysilicon are used as an etch-stop during the SAS etch which removes oxide only.

Second photoresist layer (180) is removed using oxygen plasma ashing after the defining of SAS region (109). Subsequently, a third photoresist layer (190) is formed over the substrate and patterned as shown in both FIGS. 2e and 3e. Of the two poly-2 spacers formed laterally adjacent to one control gate, the one on the drain-to-be-formed side of the cell is removed by etching through the pattern in the third photoresist layer shown in FIG. 3e. Etching is performed with high selectivity to oxide using a recipe comprising $O_2$, HBr, $Cl_2$ and He. It will be noted that this etching removes poly-2 also over the STI regions not covered by the third photoresist layer. Further, the remaining 30 to 60 Å thick second gate oxide layer over the SAS region serves as an etch stop and protects the underlying silicon from damage during poly-2 etching.

Figure 2F:
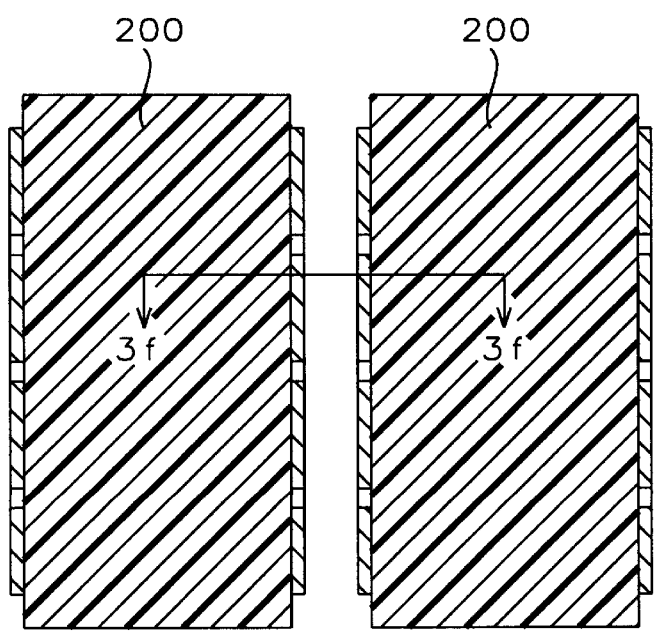
Figure 2G:
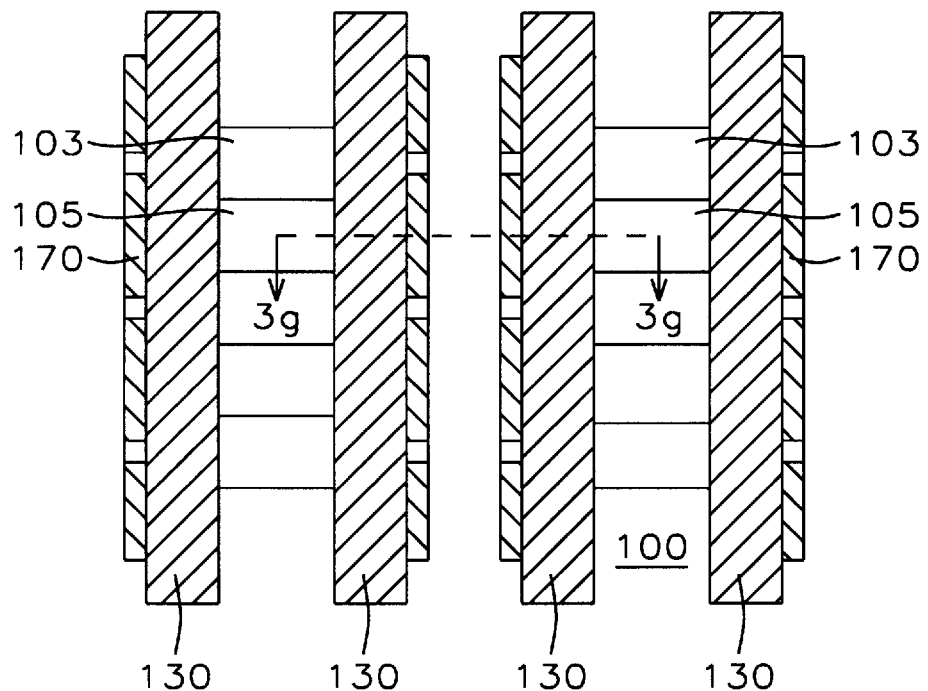
Figure 2H:
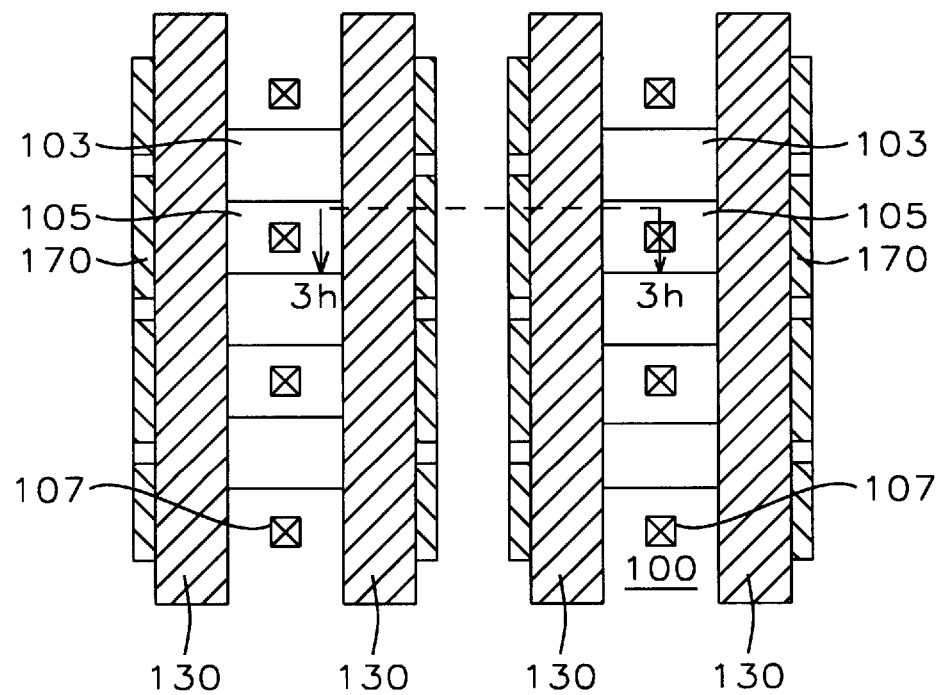
Figure 3F:
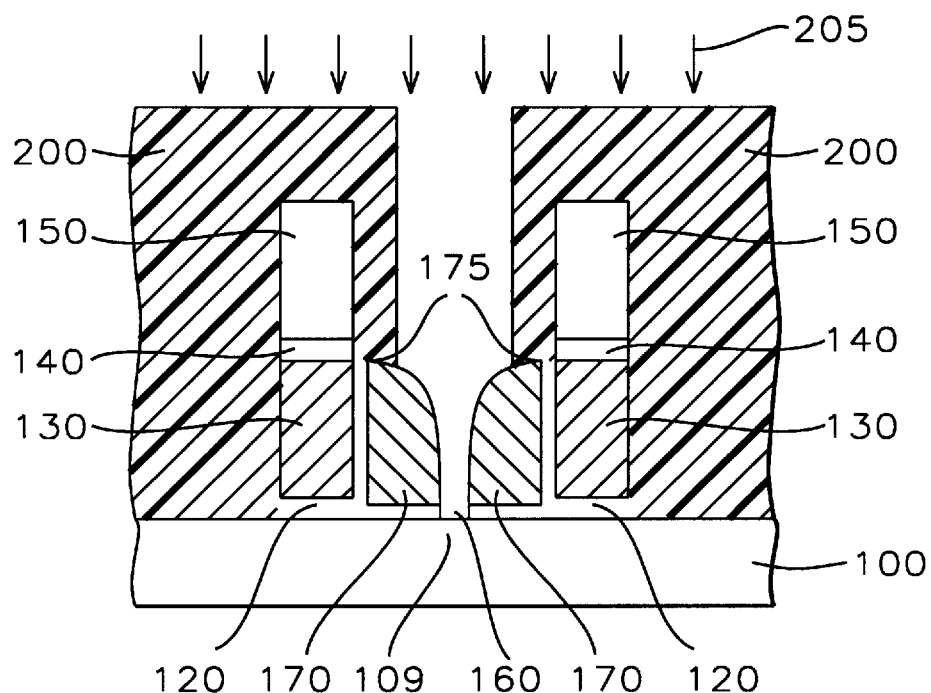
Figure 3G:
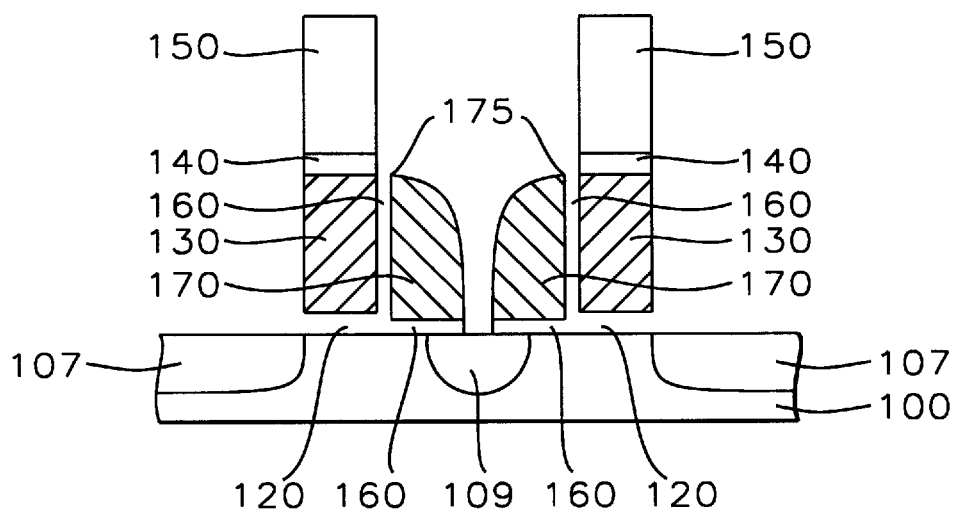
Figure 3H:
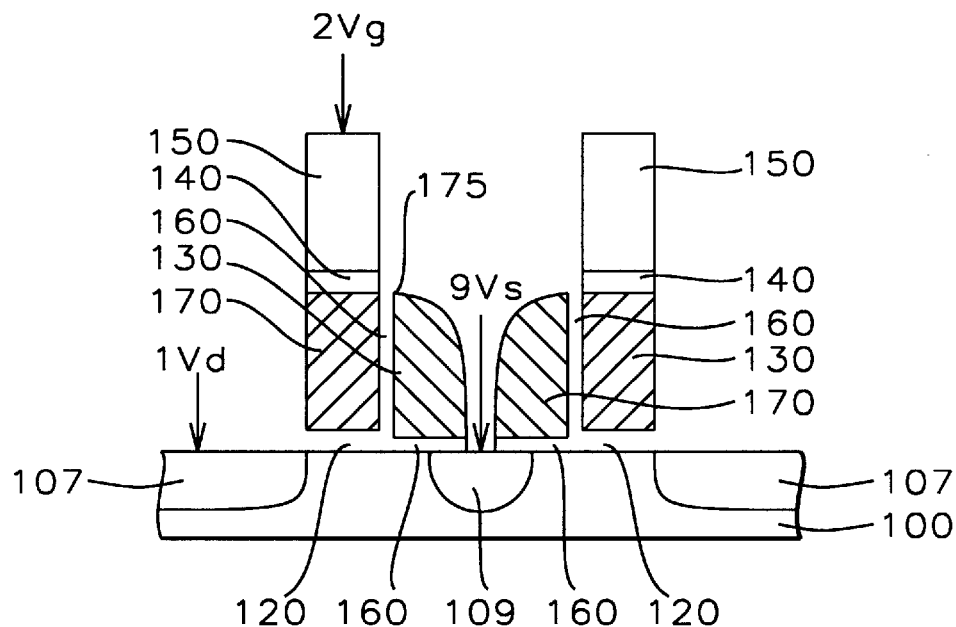
Figure 3I:
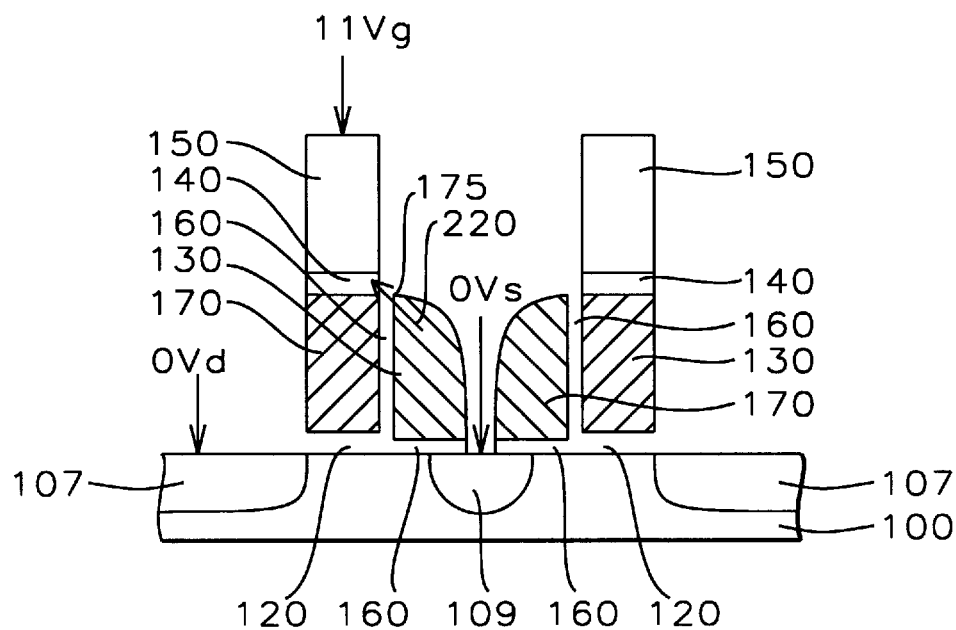

A fourth photoresist layer (200) is next formed and patterned over the substrate as shown in FIG. 2f for redefining the self-aligned source (109) shown in FIG. 3f. The SAS is next etched to remove completely the remaining field, or isolation oxide in regions (103) over the source area. This is followed by ion implanting (205) the SAS with phosphorous ions at a dosage level between about $1 \times 10^{15}$ to $-9 \times 10^{15}$ atoms/cm$^2$ and at an energy between about 10 to 60 KeV. Subsequently, the photoresist layer is removed by oxygen plasma ashing. The source implant diffusion is further increased during annealing of the tungsten silicide at a temperature between about 800 to 900° C., as shown in FIG. 3g. Drain (107) is next formed by ion implanting the drain region with arsenic ions at a dosage between about $1 \times 10^{15}$ to $4 \times 10^{15}$ atoms/cm$^2$ and at an energy between about 10 to 60 KeV. A top view of the substrate corresponding to these process steps are shown in FIGS. 2g and 2h.

The forming of the split-gate flash memory cell according to this invention is completed by depositing an interlevel dielectric layer (ILD) to a thickness between about 10000 to 15000 Å, and opening contact holes and filling them with metal (not shown) following the present state of the art methods.

In FIGS. 2h–a, programming operation of the disclosed split-gate flash memory cell is depicted where the source voltage $V_a$ is set at 9 volts, the drain voltage $V_d$ at 1 volt, while the gate voltage $V_g$ is set at 2 volts. Thus, electrons are transferred to the floating gate (170) as shown by the arrow (210) in the same FIGS. 2h–a. For the erasing operation shown in FIGS. 2h–b, on the other hand, the source and drain voltages are set at 0 volts, while the gate voltage at 11 volts. Under this condition, the charge on the floating gate (170) tunnel through the intergate oxide layer (160) into control gate (130), thus reversing the state of the floating gate of the memory cell. It will be noted that the enhanced sharp peak (175) of floating gate (370) improves electric field between the floating gate and the control gate and hence promoting faster erase operation, while the spacer floating gate self-aligned to the vertical control gate improves programmability, decreases the variability of program, and the self-aligned source alleviates punch-through from the source to drain.

While the invention has been particularly shown and described with reference to the preferred embodiments thereof, it will be understood by those skilled in the art that various changes in form and details may be made without departing from the spirit and scope of the invention.

What is claimed is:

1. A method of forming split-gate flash memory cell having a self-aligned source as well as a floating gate self-aligned to control gate comprising the steps of:

providing a silicon substrate having a plurality of active and field oxide isolation regions defined by shallow trench isolation (STI) regions;

forming a first gate oxide layer over said substrate;

forming a first polysilicon (poly-1) layer over said first gate oxide layer;

forming a silicide layer over said poly-1 layer;

forming a tetraethyl orthosilicate (TEOS) layer over said silicide layer;

forming a first photoresist layer over said TEOS layer;

patterning said first photoresist layer to define a control gate area;

etching said TEOS layer and said silicide layer through said patterning in said first photoresist layer and forming opening in said TEOS layer exposing portion of said poly-1 layer;

etching said exposed portion of said poly-1 layer and forming a control gate;

removing said first photoresist layer;

forming a second gate oxide layer over said substrate;

forming a partial-depth second polysilicon (poly-2) layer over said second gate oxide layer;

etching said partial-depth poly-2 layer to form a drain spacer and a source spacer and a sharp peak therein;

forming a second photoresist layer over said substrate to define a self-aligned source (SAS) region;

etching partially said field oxide isolation layer through said second photoresist layer in said SAS region;

removing said second photoresist layer;

forming a third photoresist layer over said substrate with openings exposing said poly-2 drain spacer and said poly-2 covering said STI regions;

etching through said openings in said third photoresist layer to remove said poly-2 drain spacer and said poly-2 covering said STI regions to form a floating gate cell;

forming a fourth photoresist layer over said substrate to redefine a self-aligned source (SAS) region;

etching completely said field oxide isolation layer through said fourth photoresist layer until said silicon substrate is reached in said SAS region;

ion implanting said SAS region;

removing said fourth photoresist layer;

annealing said silicide layer;

forming a drain in said substrate; forming an interlevel dielectric layer (ILD) over said substrate; and forming a metal contact in said ILD layer to complete the forming of said split-gate flash memory cell.

2. The method of claim 1, wherein said forming said first gate oxide layer is accomplished by thermal growth at a temperature between about 850 to 950° C.

3. The method of claim 2, wherein said gate oxide layer has a thickness between about 190 to 210 angstroms (Å).

4. The method of claim 1, wherein said forming a poly-1 layer is accomplished with silicon source $SiH_4$ using LPCVD at a temperature between about 550 to 620° C.

5. The method of claim 1, wherein said poly-1 layer has a thickness between about 900 to 1100 angstroms (Å).

6. The method of claim 1, wherein said forming silicide is accomplished by co-sputtering tungsten and silicon.

7. The method of claim 6, wherein the thickness of said silicide layer is between about 800 to 1500 Å.

8. The method of claim 1, wherein said forming said TEOS layer is accomplished by decomposing tetraethyl orthosilicate at a temperature between about 600–650° C.

9. The method of claim 1, wherein said TEOS layer has a thickness between about 1900 to 2100 Å.

10. The method of claim 1, wherein said etching said TEOS layer is accomplished with etch recipe comprising $O_2$ gas.

11. The method of claim 1, wherein said etching said exposed portion of said poly-1 layer is accomplished with a recipe comprising gases containing HBr, $Cl_2$, He and $O_2$.

12. The method of claim 1, wherein said forming said second gate oxide layer is accomplished by thermal growth at a temperature between about 850 to 950° C.

13. The method of claim 1, wherein said second oxide layer has a thickness between about 70 to 90 Å.

14. The method of claim 1, wherein said forming said partial-depth poly-2 layer is accomplished with silicon source $SiH_4$ using LPCVD at a temperature between about 550 to 620° C.

15. The method of claim 1, wherein said partial-depth poly-2 layer has a thickness between about 1900 to 2100 Å.

16. The method of claim 1, wherein said etching said partial-depth poly-2 layer to form drain spacer and source spacer is accomplished with gases containing $O_2$, HBr, $Cl_2$ and He.

17. The method of claim 1, wherein said etching partially said second gate oxide layer is accomplished with gases containing $CF_4$, $CHF_3$ and $O_2$.

18. The method of claim 1, wherein said etching partially said isolation oxide layer is performed until said isolation oxide layer has a thickness between about 300 to 600 Å.

19. The method of claim 1, wherein said etching through said openings in said third photoresist layer to remove said poly-2 drain spacer and said poly-2 covering said STI regions to form floating gate cell is accomplished with gases containing $O_2$, HBr, $Cl_2$ and He.

20. The method of claim 1, wherein said etching completely said isolation oxide layer through fourth photoresist layer in said SAS region is accomplished with gases containing $CF_4$, $CHF_3$ and $O_2$.

21. The method of claim 1, wherein said ion implanting said SAS region is accomplished by implanting phosphorous ions with a dosage between about $1\times10^{15}$ to $9\times10^{15}$ atoms/cm$^2$ and at an energy between about 10 to 60 KeV.

22. The method of claim 1, wherein said annealing said silicide layer is accomplished at a temperature between about 800 to 900° C.

23. The method of claim 1, wherein said forming said drain is accomplished by implanting arsenic ions at a dosage level between about $1\times10^{15}$ to $9\times10^{15}$ atoms/cm$^2$ with energy level between about 10 to 60 KeV.

24. The method of claim 1, wherein said forming said interlevel ILD layer is accomplished by depositing an oxide layer to a thickness between about 10,000 to 15,000 Å.

25. The method of claim 1, wherein said forming said metal contact in said ILD layer is accomplished by patterning said ILD layer with contact hole pattern and then filling with metal.

\* \* \* \* \*